United States Patent [19]

Sakaida et al.

[11] Patent Number: 5,029,310
[45] Date of Patent: Jul. 2, 1991

[54] PRESSURE DEVELOPING DEVICE

[75] Inventors: Kazuichi Sakaida, Nagoya; Nobuyuki Matsuoka, Ichinomiya; Shigeyuki Hayashi; Takayuki Hayashi, both of Nagoya, all of Japan

[73] Assignee: Brother Kogyo Kabushiki Kaisha, Noyaga, Japan

[21] Appl. No.: 462,697

[22] Filed: Jan. 9, 1990

[30] Foreign Application Priority Data

| Jan. 14, 1989 | [JP] | Japan | ................. 1-6381 |
| Jan. 30, 1989 | [JP] | Japan | ................. 1-10141 [U] |
| Jan. 30, 1989 | [JP] | Japan | ................. 1-10142 [U] |
| Jan. 30, 1989 | [JP] | Japan | ................. 1-22268 |

[51] Int. Cl.$^5$ ................. G03B 27/52; B30B 3/04
[52] U.S. Cl. ................. 354/304; 355/27; 100/160; 100/168; 430/138
[58] Field of Search ................. 354/297, 304; 355/27, 355/28; 100/160, 168, 176; 430/138

[56] References Cited

U.S. PATENT DOCUMENTS

| 4,568,167 | 2/1986 | Sorli | ................. 354/304 |
| 4,714,943 | 12/1987 | Sakakibara et al. | ................. 355/27 |
| 4,827,312 | 5/1989 | Ogiwara et al. | ................. 355/27 |
| 4,901,103 | 2/1990 | Hayakawa et al. | ................. 355/27 |
| 4,908,633 | 3/1990 | Ohashi et al. | ................. 355/27 |
| 4,945,374 | 7/1990 | Yamamoto et al. | ................. 354/304 |

FOREIGN PATENT DOCUMENTS

62-30626  3/1987  Japan .

Primary Examiner—A. A. Mathews
Attorney, Agent, or Firm—Kane, Dalsimer, Sullivan, Kurucz, Levy, Eisele and Richard

[57] ABSTRACT

In a pressure developing device, employed in an image recording unit, including a pair of pressure developing rollers for pressurizing a material on which a visible image is to be developed through elastic springs, provided are backup rollers arranged to be brought into contact with each of the pair of pressure developing rollers. Thus, a pressure force generated between the pair of pressure developing rollers are uniformly applied to the material along a direction which the pair of pressure developing rollers are extended. Further, a pressure force, i.e., a length of each of the elastic springs is arranged to be adjusted from the outside of the pressure developing device with a simple operation by means of a screw and so forth.

5 Claims, 11 Drawing Sheets

PRESSURE DEVELOPING DEVICE

BACKGROUND OF THE INVENTION

The present invention relates to a pressure developing device, including a pair of pressure developing rollers, employed in a printer or copying machine which uses a photo and pressure sensitive recording sheet, more particularly to a pressure developing device further including backup rollers for pressurizing each of pair of pressure developing rollers, while being arranged in such a manner that a pressure force generated between the pair of pressure developing rollers is adjusted from the outside of the pressure developing device.

Conventionally, this type of pressure developing device is provided with only a pair of pressure rollers rather than with a pair of backup rollers arranged to be brought into and out of contact with each of the pair of pressure developing rollers. Therefore, to withstand a high load applied in a pressure developing process, large diameter pressure rollers for pressurizing the pressure and photo sensitive recording sheet are used. In addition, the pair of pressure rollers are brought into and out of contact with each other and rotatably supported in a predetermined position of a housing of the pressure developing device. Thereby, the pressure rollers are not arranged to be brought into and out of contact with each other.

However, when conducting a pressure developing operating using a micro-capsule sheet disclosed in Japanese Patent Provisional Publication SHO No. 58-88739 which had been filed by the Mead Corporation(the corresponding U.S. application is U.S. Pat. No. 4,399,209), for example, as the photo and pressure sensitive recording sheet, a load of 700 kg/cm$^2$ or more should be applied. It is around twice the pressure force necessary for pressuring and fixing the conventional toner images. Therefore, in the conventional pressure developing device described above, unless diameters of the pair of pressure rollers are very large, the pair of pressure rollers are deformed in the pressure developing state, i.e., a pressure force is generated between the pair of pressure developing rollers. Therefore, an equal pressure force along a longitudinal direction of the pair of pressure developing rollers cannot be applied to the micro-capsule sheet. In addition, when the diameter of the pressure rollers are very large, the pressure developing device also becomes large and the weight also increases.

Further, in the conventional pressure developing device, it is difficult to set a pressure force accurately with a simple operation. For generating a pressure force, an elastic spring arranged to be brought into contact with the pressure developing rollers is generally employed. This type of the pressure developing device is disclosed in Japanese Patent Provisional Publication SHO No. 62-30626. In this type of pressure developing device, a spring supporter is composed of a bolt which is concentrically fastened to a frame and a washer disposed between the bolt and the spring. The bolt is contacted with the other end of the spring through the washer at one end so as to keep applying a predetermined amount of load, i.e., a predetermined pressure force, to the spring. At the center of the bolt, a through hole which is axially open is formed. When adjusting the pressure force, the entire pressure developing device is set to a jig main unit. After that, a piston rod of a hydraulic cylinder is inserted into the through hole of the bolt and contacted with the washer, thereby compressing the spring through the washer. On the hydraulic cylinder, a hydraulic pressure gauge is provided. In accordance with the amount of the hydraulic pressure, the spring load can be determined. When a predetermined amount of load is produced by the spring, an operation of the hydraulic cylinder is stopped and the bolt is screwed until it is contacted with the washer, thereby keeping the spring load to the predetermined value.

However, it is difficult to set the pressure developing device to the jig main unit. In addition, a stroke of the piston rod is large, so that a size of the hydraulic cylinder becomes large. The piston rod is inserted from the through hole of the bolt to the frame and a load is applied to the spring through the washer. However, when the frame is set to the jig main unit, it is necessary to escape the frame, bolt, and so forth in proper positions so that they do not interfere with the piston rod. Thus, it is difficult to set the pressure developing device to the jig main unit. In addition, since the distance between the escape position of the piston rod and the operation position is large and thereby the stroke of the piston rod increases, the hydraulic cylinder, that is, the size of the entire adjustment jig becomes large, resulting in increasing the weight, cost, installation space, and so forth. Moreover, it is also necessary to improve the positioning accuracy of the jig main unit of the pressure development apparatus for inserting the piston rod into the through hole of the bolt. Thereby, the adjustment work becomes complicated.

SUMMARY OF THE INVENTION

It is therefore an object of the invention to provide an improved a pressure developing device capable of applying a pressure force uniformly along a longitudinal direction of a pair of pressure developing rollers, while capable of setting a pressure force at a predetermined value with a simple operation.

For this purpose, according to the invention, there is provided a pressure developing device including a pair of pressure developing roller members at least arranged to be brought into contact with each other for pressurizing a material on which a visible image is to be developed, said pressure developing device comprising:

pressure force generate means for generating a variable pressure force between said pair of pressure developing roller members;

set means for setting said pressure force generated by said pressure force generate means to a predetermined value; and exchange means for exchanging said pair of pressure developing roller members between a first state in which said pressure force is operated at said predetermined value and a second state in which said pressure force is controlled so as to be less than said predetermined value.

DESCRIPTION OF THE EMBODIMENTS

Referring to the figures, an embodiment of the present invention is described hereinafter.

Figure 1:
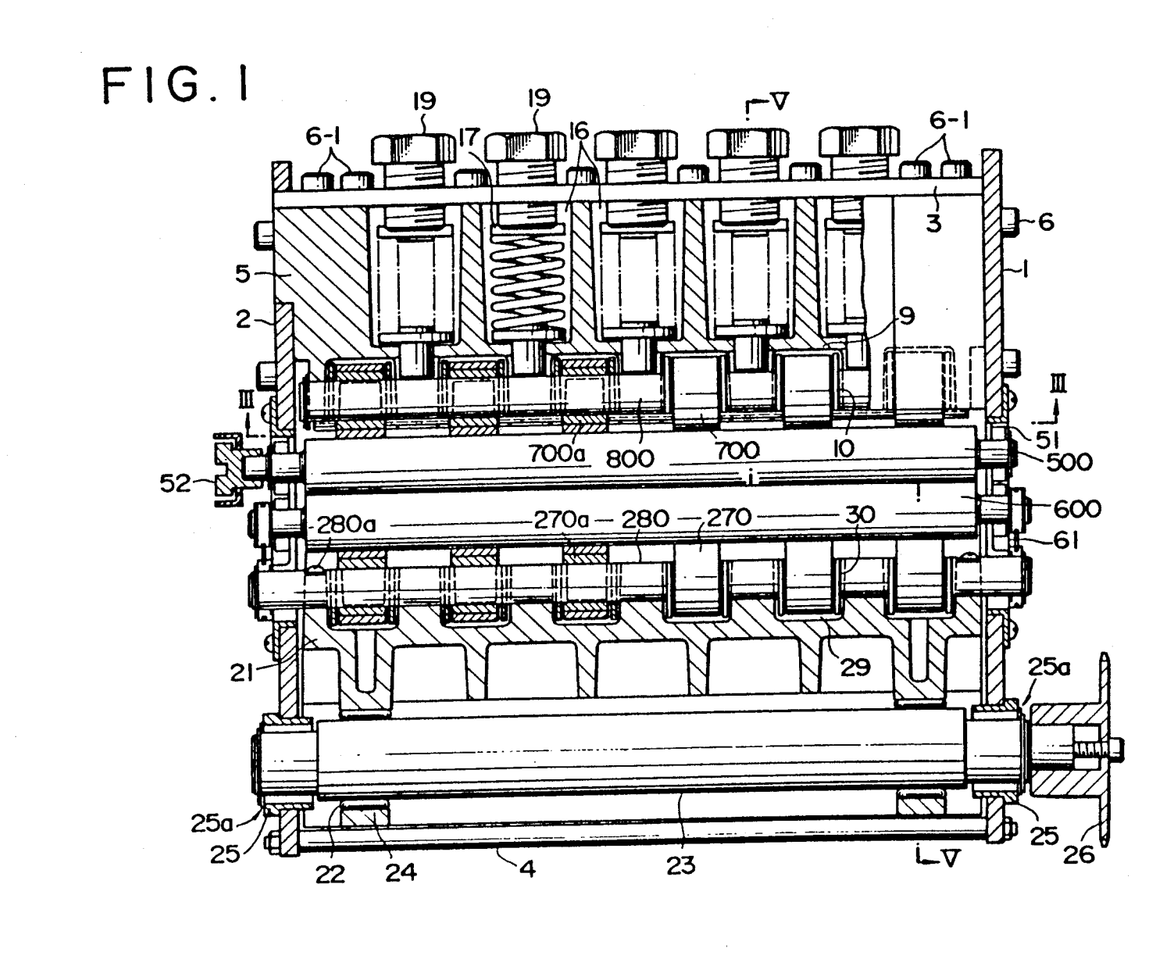
FIG. 1 shows a front sectional view of a pressure developing device according to the present invention.

FIG. 1 is a front sectional view of a pressure developing device. As shown in the figure, a pair of left and right side plates 1 and 2 are opposed at a predetermined distance, the top portion thereof being fastened with an upper plate 3, the bottom portion thereof being fastened with a lower shaft 4. On the upper side between the side plates 1 and 2, an upper frame 5 is fastened with fixing bolts 6. The upper frame 5 is fastened to the upper plate 3 with another the fixing bolts 6-1.

At the bottom of the upper frame 5, a plurality of backup rollers 700 rotatably mounted on a roller shaft 800 through a bearing 700a are disposed at a predetermined interval in an axial direction, the backup rollers 700 being movable vertically for several millimeters. In the positions according to individual backup rolls 700 of the upper frame 5, a plurality of concave portions 9 where most portions of the backup rollers 700 can be inserted are disposed.

Figure 3:
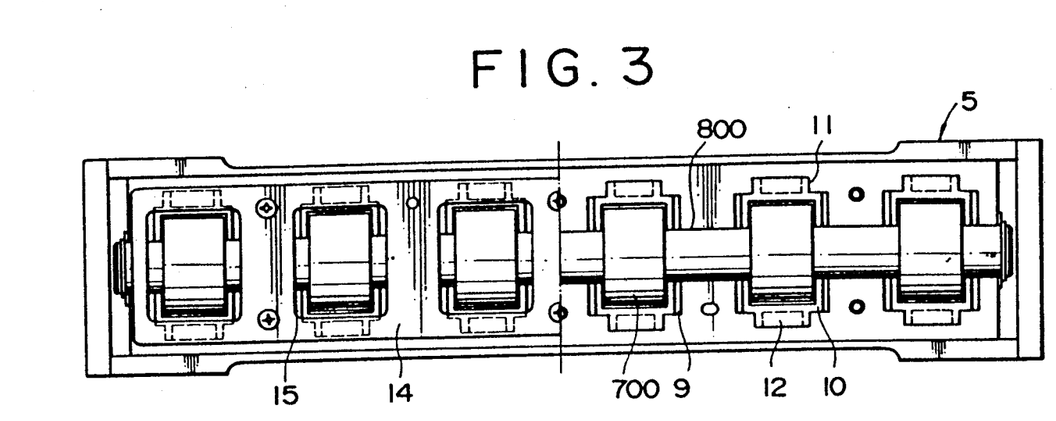
FIG. 3 shows a sectional view of the pressure developing device of FIG. 1 taken from II—II.
Figure 4:
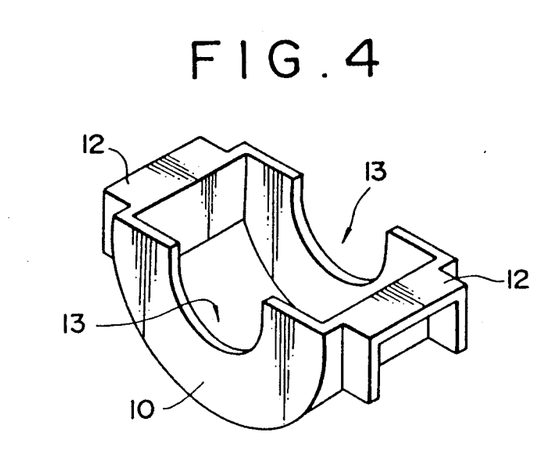
FIG. 4 shows a enlarged perspective view of a frame part incorporated in the pressure developing device of FIG. 1.

A positioning frame part 10 which is a flexible part made of soft synthetic resin which can be deformed by a load is engaged with each concave portion 9 as shown in FIG. 3. On the front and rear of the frame part 10, as shown in FIG. 4, a pair of engagement portions 12 which can be engaged with the engagement grooves 11 opposed to the concave portions 9 are provided. On the left and right walls of the frame part 10, a pair of semicircular grooves 13 which match the roll shaft 8 are disposed. The backup rollers 700 arranged along with the roller shaft 800 is inserted into the concave portion 9, part of the roller 700 being extruded outwardly, i.e., downwardly. A cover part 14 is mounted on the lower side of the upper frame 5, thereby protecting the roller shaft 800 and the backup rollers from dropping. On the cover part 14, an opening 15 where a part of each of the backup roller 700 can be extruded is respectively provided.

On the upper frame 5, a plurality of spring mounting grooves 16 are provided at a predetermined interval as shown in FIG. 1. At each spring mounting groove 16, an elastic spring 17 is mounted. The spring 17 downwardly tensions the roller shaft 800 along with the backup roller 700 through a cap shape compression metal part 18. On the upper plate 3, a spring tension adjustment bolt 19 is rotatably mounted, the spring 17 being pressed at the end of the bolt 19.

Figure 5A:
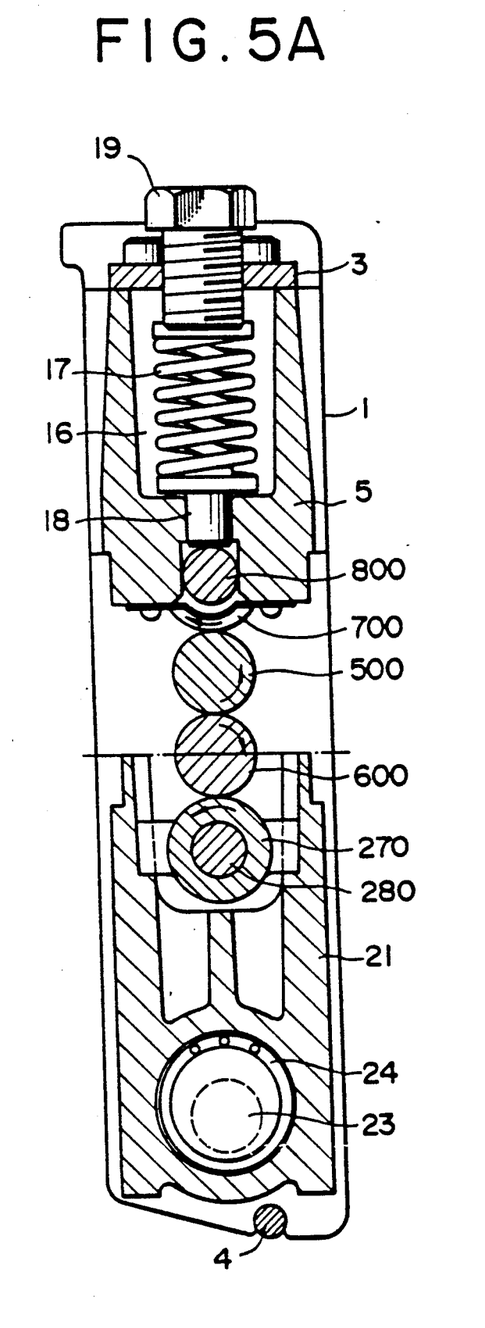
FIG. 5A shows a sectional view of the pressure developing device of FIG. 1 taken from IV—IV.
Figure 5B:
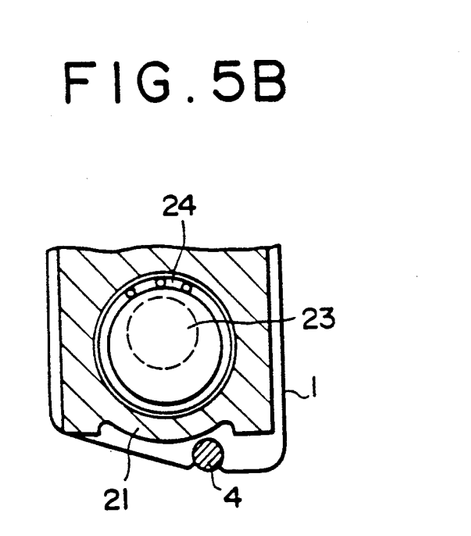
FIG. 5B shows a sectional view showing a part of an eccentric cam shaft of FIG. 5A which is rotated for a half turn.

On the lower side between the side plates 1 and 2, a lower frame 21 is disposed so that it can be vertically and slightly moved for several millimeters. In other words, as shown in FIG. 5A, an eccentric cam shaft 23 is rotatably inserted into an insertion hole 22 disposed at the lower end of the lower frame. Both the ends of the cam shaft 23 are rotatably supported by openings 25a disposed on the side plates 1 and 2 through bearings 25. The cam shaft 23 is rotated by the center of the axis line which is slightly eccentric from the center axis line for 1 to 2 millimeters, for example, through a drive gear 26. As the cam shaft 23 rotates, the lower frame 21 is vertically moved as shown in FIG. 5A and 5B.

At the upper end of the lower frame 21, as shown in FIG. 1, a plurality of backup rollers 270 which are rotatably mounted to a roller shaft 280 in an axial direction at a predetermined interval through a bearing 270a are fastened through the roller shaft 280 with set screws 280a. In the position according to each backup roller 270 of the lower frame 21, like the upper frame 5, a plurality of concave portions 29 are disposed. Part of the roller 270 is outwardly, i.e., upwardly, extruded from the concave portion 29. The backup roller 270 is supported through positioning frame parts 30 which are inserted into the individual concave portions 29, the positioning frame parts 30 being made of soft synthetic resin which is deformed by a load. The frame parts 30 are the same as the upper frame parts 10.

Figure 6:
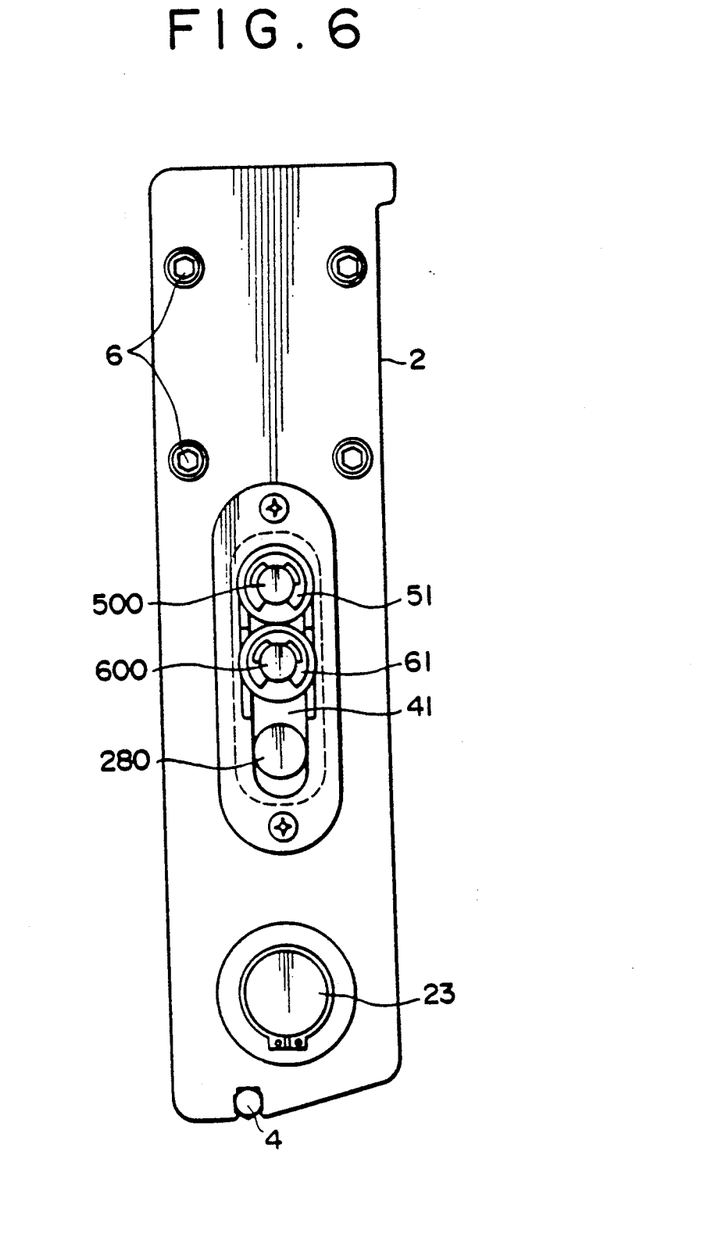
FIG. 6 shows a left side view of the pressure developing device of FIG. 1.

In the nearly center position of the side plates 1 and 2, an oval hole 41 is disposed, as shown in FIG. 6. One end of the roller shaft 280 of the backup roller 270 is inserted into the oval hole 41, the roller shaft 280 being vertically slidable.

An upper pressure roller 500 of a pair of pressure rollers, i.e., work rollers, 500 and 600 is inserted into the upper portion of the oval hole 41 through a bearing 51, the upper pressure roller 500 being rotatable and vertically movable slightly. In this state, each backup roller 700 is contacted with the pressure roller 500, the pressure roller 500 being downwardly tensioned through the spring 17. At one end of the pressure roller 500, a joint 52 for transferring a motion is mounted, the pressure roller 500 being driven by means of a drive unit, not shown.

The lower pressure roller 600 is inserted into the middle portion of the oval hole 41, the lower pressure roller 600 being rotatable and lightly vertically movable through bearings 61 at both the ends thereof. In this condition, the pressure roller 600 is disposed on each backup roller 270. Therefore, when the eccentric cam shaft 23 is in the rotation position shown in FIG. 5A, the lower pressure roller 600 is pushed up through the lower frame 21 and the backup roller 270 as shown in FIG. 1 and 5A. Thereby, the lower pressure roller 600 is contacted with the upper pressure roller 500. On the other hand, when the eccentric cam shaft 23 is in the rotation position shown in FIG. 5B, the lower pressure roller 600 is lowered along with the lower frame 21 and the backup roller 270. Thereby, the lower pressure roller 600 goes away from the upper pressure roller 500. In other words, the lower pressure roller 600 is switched between a pressure developing state, i.e., operation state in which the upper pressure roller 500 is contacted with the lower pressure roller 600 and the non-operation state in which the upper pressure roller 500 is away from the lower pressure roller 600 by the rotation of the eccentric cam shaft 23.

Figure 2:
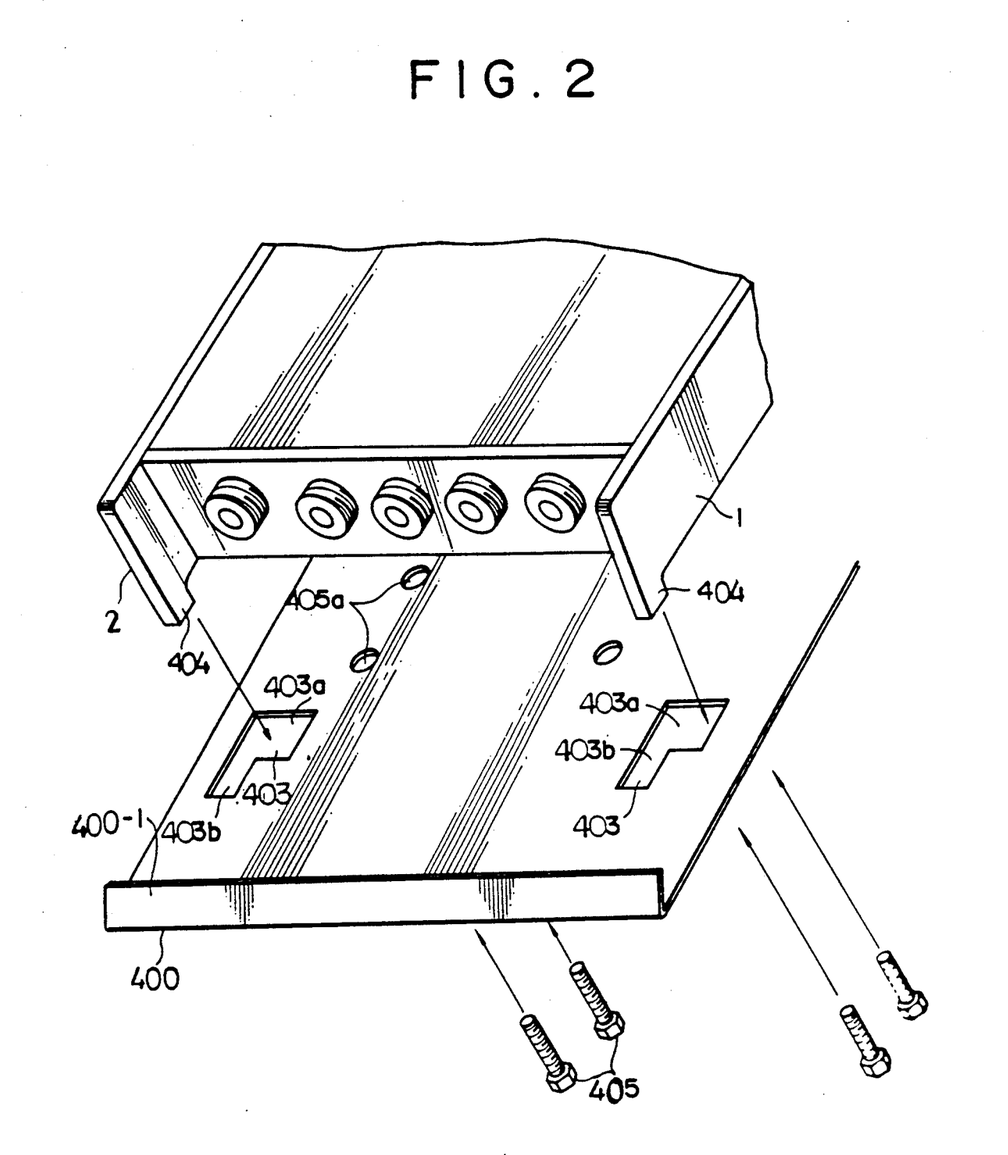
FIG. 2 shows a perspective view of a fixing structure of the pressure developing device according to the present invention on a mounting part.

A mounting part 400, as shown in FIG. 2, of the pressure developing device is composed of a plane plate part forwardly and downwardly inclined, the front end which is upwardly bent being formed on a flange 400-1. In the positions according to a pair of positioning nails 404, 404 of the mounting part 2, positioning openings 403, 403 are disposed in parallel with each other. Each opening 403 consists of a loose insertion opening 403a which is slightly larger than the nail 404 and an engagement opening 403b whose width is the nearly same as the positioning nail 404, the loose insertion opening 403a being adjacent to the engagement opening 403b in a reversed "L" shape as shown in the drawing. In other words, the pair of openings 403 are made in the manner that the left side is straight; the right side is in a staircase shape; the engagement opening 403b on the front end side has the same width as the positioning nail 404; and each of left and right positioning nails 404 can be easily inserted into the loose insertion opening 403a. On the mounting part 400 in the positions according to the bolt screw holes, not shown, where the left and right positioning nails 404, 404 are engaged with the engagement openings 403b and the pressure developing device is positioned on the mounting part 400, through holes 405a of bolts 405 are disposed.

Next, by referring to FIG. 7 through 13, a pressure force adjusting and setting process of the above structured pressure developing device is described hereinafter.

Figure 7:
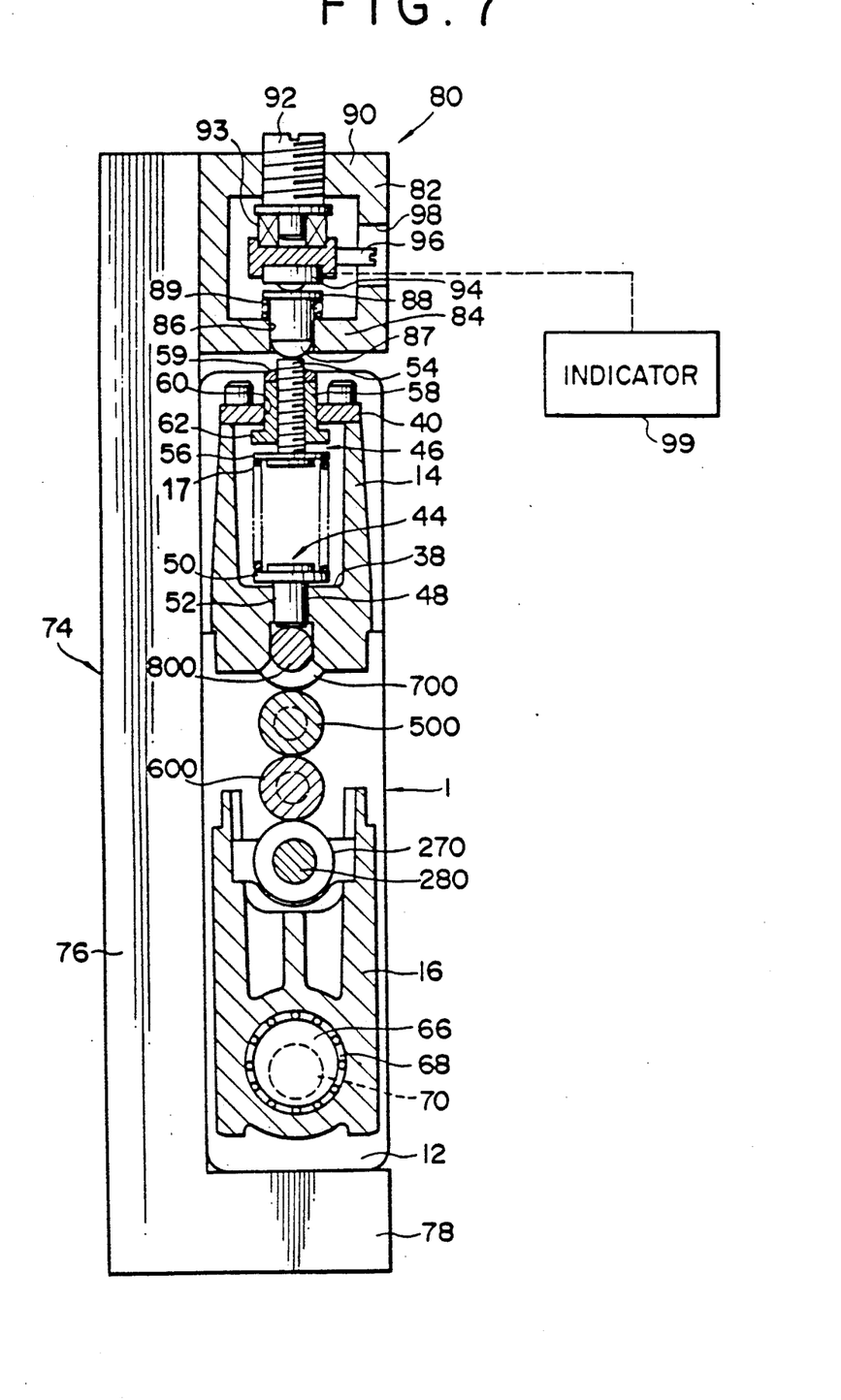
FIG. 7 shows a sectional view of the pressure developing device in a pressure force setting state with a process according to the present invention.
Figure 8:
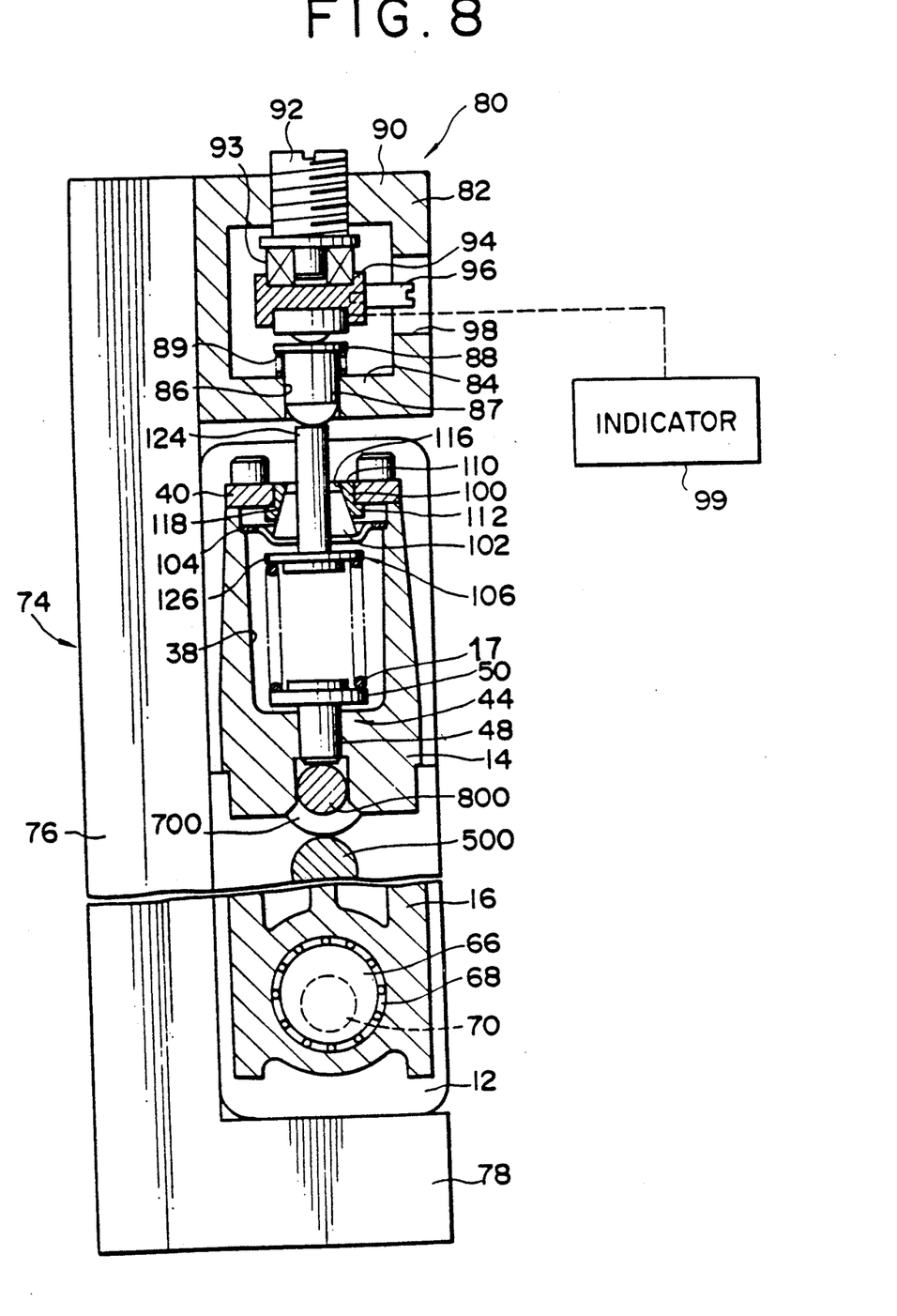
FIG. 8 shows a sectional view of the pressure developing device in a pressure force setting state with an another process according to the present invention.

FIG. 7 shows the pressure developing device and an adjustment jig which is embodied to the pressure developing device for adjusting and setting a pressure force between the pair of pressure rollers incorporated in the above pressure developing device. The frame 1 is provided with a pair of side plates 2 each of which is opposed in the vertical direction at a predetermined distance and with a first block 14 and a second block 16 which are disposed between the side plates 1 and 2. The first block 14 is fastened between the side plates. The second block 16 is disposed in the lengthwise direction of the side plate 2 at a distance with the first block 14 so that the second block 16 is movable in the lengthwise direction. An extruded portion of the second block 16 is vertically and slidably engaged with a through hole made on the side plate 2. At a portion between the first block 14 and the second block 16 of the side plate 2, pressure rollers 500 and 600 are provided. In a pressure position where the pressure rollers 500 and 600 are contacted with each other and a photo and pressure sensitive sheet is pressurized, a plurality of sets of backup rollers 700 and 270 are disposed on the opposite side of the axial centers of the pair of pressure developing rollers 500 and 600. The backup rollers 280 which support the pressure roller 500 is disposed in parallel therewith and mounted to a backup shaft 800 which is vertically and movably supported to the first block 14, the backup rollers 700 being rotated by the backup shaft 800 at an equal interval. The backup rollers 270 which support the one of the pressure rollers 600 is disposed in parallel with the pressure rollers 500 and 600, the backup rollers 270 being rotatably mounted to a backup shaft 280 supported by the second block 16. Both ends of the backup shaft 280 are vertically and movably engaged with the side plate 2.

At both portions where the first block 14 is contacted with the backup roller 700, bottomed holes 38 are formed and they are closed with a plate 40. In each bottomed hole 38, a compression coil spring 17, a first spring holder 44, and a second spring holder 46 are housed. The first spring holder 44 is composed of a shaft 48 and a support plate 50 which is fastened to one side thereof. The support plate 50 supports one end of the compression coil spring 42. The shaft 48 is slidably engaged with a through hole 52 made at the bottom of the bottomed hole 38 and contacted with the backup shaft 800. The second spring holder 46 is composed of a screw 54 and a support plate 56 which is fastened to one end thereof. The second spring holder 46 supports the other end of the spring 17 on a support plate 56. The screw 54 is secured with a nut 58 and a lock nut 59. The nut 58 and the screw 54 are inserted into a round hole 60 made on the plate 40 and extruded externally from the frame 1. The second spring holder 46 is movably held by the frame 1 in parallel with the direction of the load of the compression coil spring 17 through the nut 58. At one end of the nut 58, a flange portion 62 whose diameter is larger than that of the round hold 60 is formed and housed in the bottomed hole 38. By contracting the flange portion 62 with the plate 40, the second spring holder 46 does not drop from the bottomed hole 38, namely, the second spring holder 46 is not relatively retreated from the first block 14. The nut 58 forms a retreat protection mechanism. The nut 58 also structures a spring support unit along with the second spring holder 46. At the portion where the nut 58 is extruded externally from the frame 1, a tool engagement portion for engaging a tool such as a spanner is provided.

On the other hand, a cam 66 is engaged with the second block 16 through a bearing 68. A shaft 70 of the cam 66 is eccentric to the center of the cam 66, the shaft 70 being rotatably supported by the side plate 2. When the portion where the distance from the axial center of the shaft 70 of the cam surface of the cam 66 is the shortest is placed in the top position, the pair of pressure rollers 500 and 600, and the backup rollers 700 and 270 are placed in the bottom position. When the support plate 50 of the first spring holder 44 is contacted with the bottom surface of the bottomed hole 38, the tension of the compression coil spring 17 does not work to the backup shaft 800, so that the pressure rollers 500 and 600 become a no-pressure state. In this state, when the shaft 70 is rotated by a driving motor, not shown, the second block 16, the backup rollers 700 and 270, and the pressure rollers 500 and 600 are raised. When the backup shaft 800 causes the support plate 50 of the first spring holder 44 to be separated from the bottom surface of the bottomed hole 38, the tension of the compression coil spring 17 is applied to the pressure rollers 500 and 600, thereby producing a pressure force therebetween. Consequently, the pressure state takes place.

The pressure force of the pressure developing device in the structure described above can be adjusted by varying a load of the compression coil spring 17. A jig main unit 74 for adjusting the pressure force can be set in the condition that the frame 1 is provided with the pressure rollers 500 and 600, the backup rollers 700 and 270, and so forth. The jig main unit 74 is equipped with a column 76 which is vertically extendible and with a table 78 horizontally extended from the lower portion of the column 76. At the upper portion of the column 76, a plurality of loading units 80, same as the number of the spring 17, are disposed at the same interval as that of the compression coil springs 17. The sectional shape of a supporting frame 82 of the loading device 80 is a square. The supporting frame 82 is fastened to the column 76. On a lower wall 84 of the supporting frame 82, a through hole 86 which is vertically extended is formed and a push pin 87 which is a loading part is slidably engaged. At the top portion of the push pin 87, a flange portion 88 is formed. A weak compression coil spring 89 is disposed between a flange portion 88 and the lower wall 84 is disposed, thereby always upwardly tensioning the pressure pin 87, namely, in the pulling direction of the supporting frame 82. In addition, a screw 92 is fastened to an upper wall 90 of the supporting frame 82. Between the push pin 87 and the screw 92, a thrust baring 93 and a load sensor 94 are disposed. In the load sensor 94, a fixed extrusion 96 is inserted into an oval hole 98 made on the column 76, thereby allowing the load sensor 94 to vertically move and preventing it from rotating. The load sensor 94 is connected to a load display unit 99, thereby displaying a load produced by the compression coil spring 17.

The pressure force of the pressure developing device is adjusted when it is produced or an image recording unit on which the pressure developing device is mounted is adjusted. In the former case, the adjustment is made before the frame 1 is mounted to the image recording unit. In the latter case, after the entire frame 1 is removed from the image recording device, it is mounted on the table 78 of the jig main unit 74. At the time, in the pressure developing device, the pressure rollers 500 and 600 are separated each other so as to be the non-pressure state and the pressure rollers and so forth are placed in the lowest position. In addition, the screw 92 is loosened and the pressure pin 87 is pulled into the supporting frame 82, so that the pressure developing device can be mounted. After the pressure developing device is mounted, the pressure rollers 500 and 600 are contacted with each other. Thereby, the screw 54 of the first spring holder 44 is contacted with the pressure pin 87. Then, the operator engages a tool with the screw 92 and screws it. Thereby, the pressure pin 87 pushes the first spring holder 44, so that the first spring holder 44 compresses the compression coil spring 17 and applies a load. When the load being applied becomes a predetermined setting value which is detected by the load sensor 94, the rotating operation is stopped. While the rotation of the second spring holder 46 is protected, the rotating operation of the nut 58 is performed. When the flange portion 60 is contacted with the plate 40, the lock nut 59 is tightened. Thereby, the second spring holder 46 is fixed in a position where the spring load produced by the rotating operation of the screw 92 is kept, so that a spring load necessary for the desired pressure force is obtained. After the pressure force is adjusted, the pressure rollers 500 and 600 are separated each other so as to be the non-pressure state. By loosening the screw 92, the frame 1 is removed from the jig main unit 74. After that, the frame 10 is mounted to the image recording unit.

Figure 9:
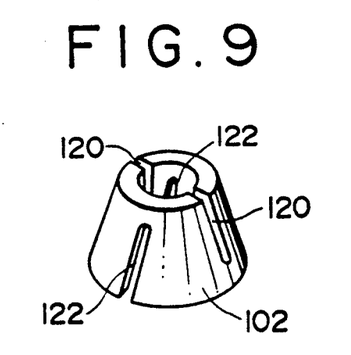
FIG. 9 shows a perspective view showing a collet structuring as a retreat protecting mechanism embodied in the pressure force setting process of FIG. 8.
Figure 10:
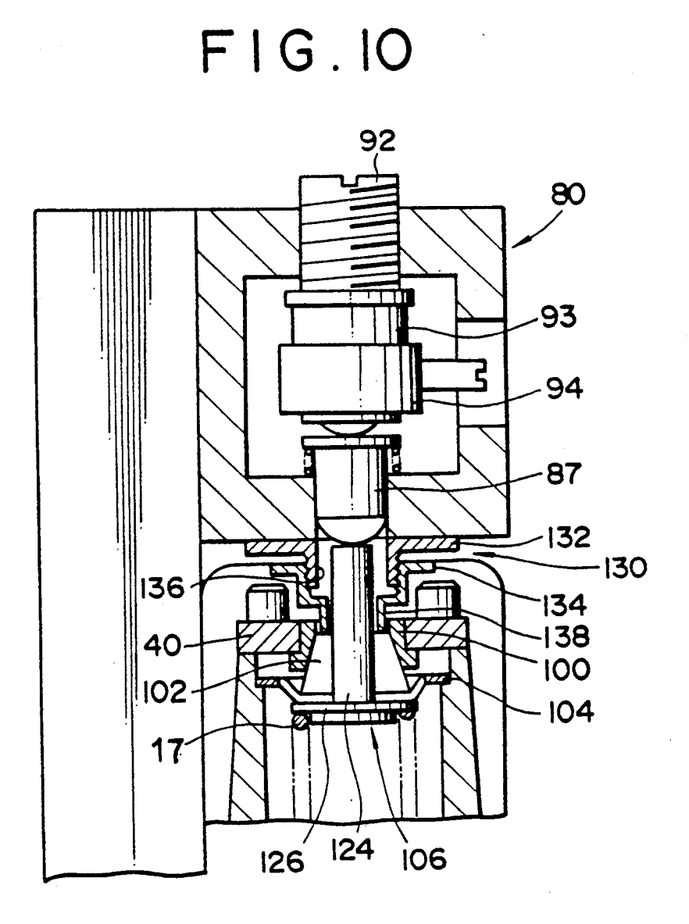
FIG. 10 shows a sectional view where a load removal device is provided in a pressure force setting jig shown in FIG. 8.

FIG. 9 and 10 show an another embodiment. In this embodiment, a retreat protection mechanism of a pressure developing device is composed of a sleeve 100, a collet 102, and a spring 104. The structure of a second spring holder 106 of this embodiment differs from that of the previous embodiment. The other structure of this embodiment is the same as that of the previous embodiment.

The sleeve 100 is pushed into a through hole 110 made on the plate 40. A flange portion 112 formed at one end is engaged with the plate 40, thereby preventing the sleeve 100 from dropping from the through hole 110. The inner periphery of the sleeve 100 is a taper inner periphery surface 116 where the diameter gradually decreases as it is away from the compression spring 17. A collet 102 has a taper outer periphery surface 118 according to the taper inner periphery surface 116. As shown in FIG. 9, on a periphery wall of the collet 102, two slits 120, 120 and 122, 122 are alternately formed on each end surface of the collet 102. The collet 102 is engaged with the sleeve 100 and tensioned by the spring 104 mounted on the first block 14 in the direction where the collet 102 is deeply engaged with the sleeve 100. The shape of the spring 104 is a ring. On the inner periphery, a plurality of open slits are formed.

A second spring holder 106 is composed of a rod 124 and a support plate 126 fixed to one end thereof. The support plate 126 holds the other end of the compression coil spring 17. The rod 124 is axially and slidably engaged with the collet 102, the other end thereof being extruded externally from the plate 40. When an external force is not applied to the rod 124, the collet 102 is tensioned by the spring 104 and pushed into the sleeve 100, thereby holding the rod 124 and preventing it from retreating.

In this embodiment, when a pressure force is adjusted, the pressure development apparatus is set on the table 76 of the jig main unit 74. While the pressure pin 87 is contacted with the rod 124, the screw 92 is screwed. Thereby, when the rod 124 is downwardly pushed, the collet 102 overcomes the tension force of the spring 104. Consequently, the collet 102 is moved along with the rod 124 in the direction where they get out of the sleeve 100. At the same time, a diameter of the collet 102 is enlarged, thereby releasing the rod 124 being held. When the rod 124 is moved, the compression coil spring 17 is compressed and the screwing operation of the screw 92 at a desired amount of load, the collet 102 is tensioned by the spring 104 and pushed into the sleeve 100. The compressed diameter causes the rod 124 to be held and the second spring holder 106 to be kept in a position where the desired amount of load is applied.

In this embodiment, since the collet 102 prevents the second spring holder 106 from retreating by the compression of the spring 104, after the second spring holder 106 is moved, an extra operation such as tightening of nuts is not required, thereby simplifying the pressure force adjustment operation.

When it is necessary to loosen the compression of the compression coil spring 17, as shown in FIG. 10, a load removal device 130 is disposed. The load removal device 130 is provided with a cylindrical male screw 132 and a cylindrically extruded part 134. The extruded part 134 has shoulders. On the larger diameter inner periphery, a female screw 136 is formed. The smaller diameter portion is an extruded portion 138 which is contactable with the end surface of the small diameter portion of the collet 102.

The male screw 132 and the extruded part 134 are fastened to the rod 124 before the pressure developing device is set to the jig main unit 74 in adjusting the pressure force. Like the previous embodiment, a load is applied to the compression coil spring 17. When the applied load is too large or when the pressure force should be decreased, while the rotation of the male screw 132 is prevented, the extruded part 132 is rotated in a direction to which the extruded part 134 is disengaged from the male screw 132. After that, the collet 102 is pushed so as to remove it from the sleeve 100. Thereby, the collet 102 loosens the rod 124 being held, so that the rod 124 can be freely slided. In this state, when the screw 92 is rotated in the reverse direction to which a load is applied by the compression coil spring 17, the compression coil spring 17 is extended and the load is decreased. To decrease the load of the compression coil spring 17, it is possible to loosen the compression coil spring 17 until the support plate 126 of the second spring holder 106 is contacted with the spring 104 or it is also possible to loosen the compression coil spring 17 until the load sensor 94 detects the load of the spring. After the load is decreased in any case, the extruded portion 134 is deeply fastened by the male screw 132, so that the collet 102 holds the rod 124. When adjusting the load of the compression coil spring 17, it is possible to apply a load to the compression coil spring 17 with the operation of the screw 92.

Figure 11:
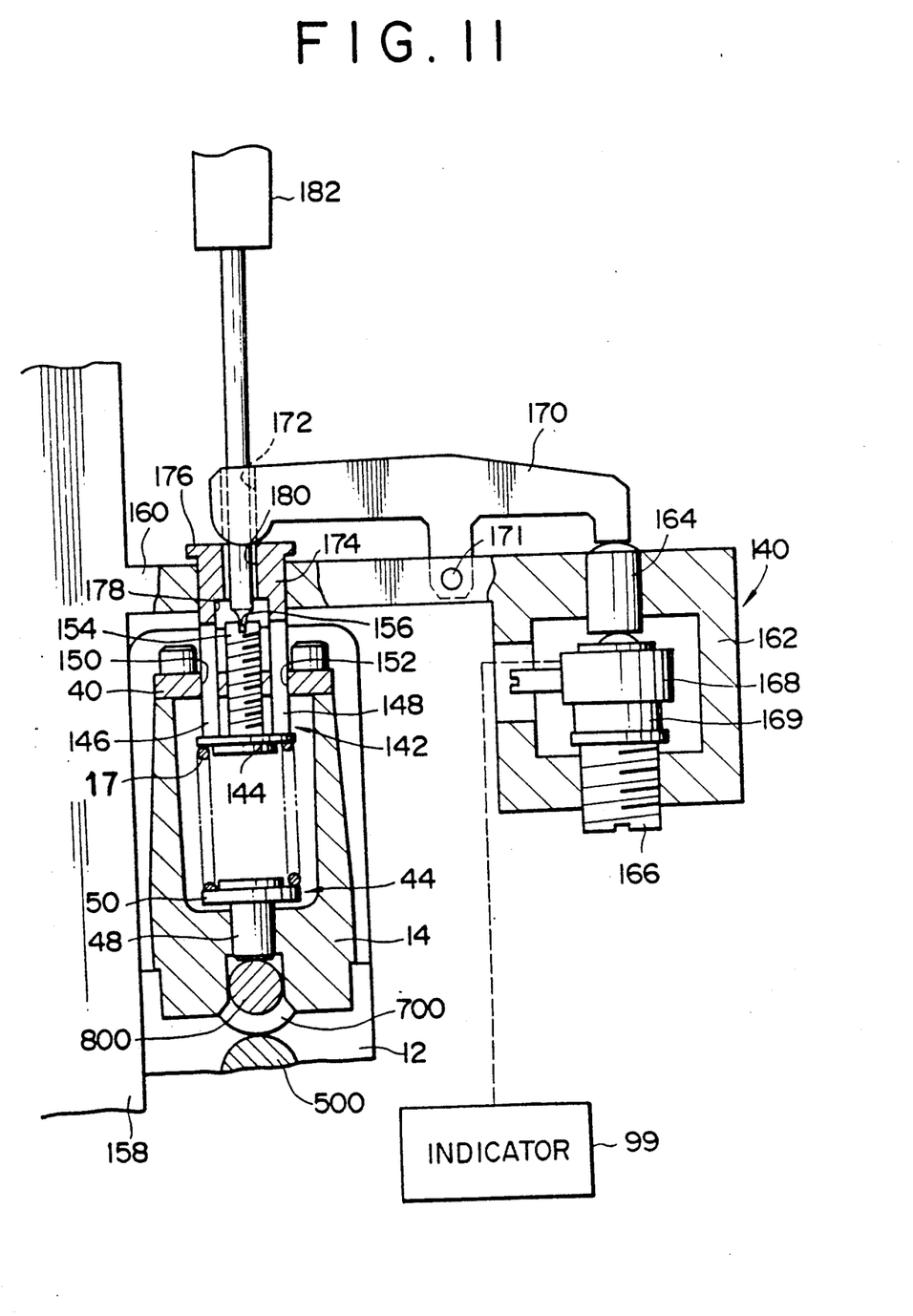
FIG. 11 shows a sectional view showing a still another pressure force setting state according to the present invention.

FIG. 11 shows a still another embodiment. In this embodiment, the structures of the spring holding device and the loading device differ from two previous embodiments. A second spring holder 142 which structures the spring holding unit is provided with a support plate 144 which is contacted with the other end of the compression coil spring 17 and two rods 146 and 148 vertically disposed in a direction in parallel with the loaded direction of the spring 17 in two positions which deviate from the center of the surface on the reverse side where the support plate 144 is contacted with the compression coil spring 17. These rods 146 and 148 are extruded externally from the plate 40 via through holes 150 and 152. A screw 154 is fastened between the through holes 150 and 152 of the plate 40, one end thereof being contacted with the support plate 144, thereby preventing the support plate 144 from retreating to the plate 40. A rotation protecting part for protecting the screw 154 from being naturally rotated is inserted into the fastened portion of the screw 154 and the plate 40. The screw 154 structures a retreat protecting mechanism. The screw 154 also structures the spring holding mechanism along with the second spring holder 17. The other end of the screw 154 is extruded externally from the plate 40, at the other end thereof a tool engagement groove 156 being formed. A jig main unit 158 of a pressure force adjustment jig is provided with a table, not shown, and a plurality of arms 160 extended from the upper portion thereof (the figure shows only one arm). On the upper wall of a support frame 162 whose section is square formed at the extruded portion of each arm 160, a push up pin 164 is vertically and slidably mounted. On the lower wall of the support frame 162, a screw 166 is fastened. A load sensor 168 and a thrust bearing 169 are disposed between the push up pin 164 and a screw 166. A detection result of the load sensor 168 is displayed with the load display unit 99 which is the same as that of the previous two embodiments.

At the center portion of the arm 160, a lever 170 is disposed rotatably by the axis line perpendicular to the longitudinal direction of the arm 160 by a shaft 171. One end of the lever 170 is contacted with the push up pin 164, at the other end thereof a through hole 172 downwardly extended being formed. At the portion with which the other end of the lever 170 of the arm 160 is contacted, a push block 174 which is a loading part is vertically and slidably engaged. The push block 174 forms a cylinder which is equal to the distance of the farthest portions of the rods 146 and 148, at the top thereof a flange 176 being formed, thereby preventing the push block 174 from dropping from the arm 176. At the lower end of the push block 174, a concave portion 178 where the lower side is open is formed. At the center thereof, a through hole 180 which is axially extended is formed.

In this embodiment, when adjusting a pressure force, the screw 166 is loosened. After that, the lever 170 is rotated for a small angle in the clockwise direction shown in FIG. 11. While the push block 174 has been upwardly moved, the frame 1 is placed on the table. The push block 174 is contacted with the rods 146 and 148 by its dead weight. After the pressure rollers 500 and 600 are placed in the pressure state, the screw 166 is fastened, by screwing the screw 166 and rotating the lever 170 counterclockwise, a load is applied to the compression coil spring 42 through the push block 174, the rods 146 and 148, and the support plate 144. At the time, the rods 146 and 148 also guide the compressed deformation of the compression coil spring 17 to the loaded direction. When the load sensor 168 detects a desired load, the screwing operation of the screw 166 is stopped. After that, by inserting a screwdriver 182 into the through holes 172 and 180, engaging the screw 154 with the tool engagement groove 156, and screwing the screw 154 until it touches the support plate 144, the load of the compression coil spring 17 is kept to the predetermined amount of load. After that, the frame 1 is removed from the jig main unit 158.

In the above individual embodiments, the entire frame 1 is mounted on the jig main unit 74 or 158. However, it is also possible to mount part of the compression coil spring 17 and the spring supporting device, thereby adjusting the pressure force.

Figure 12:
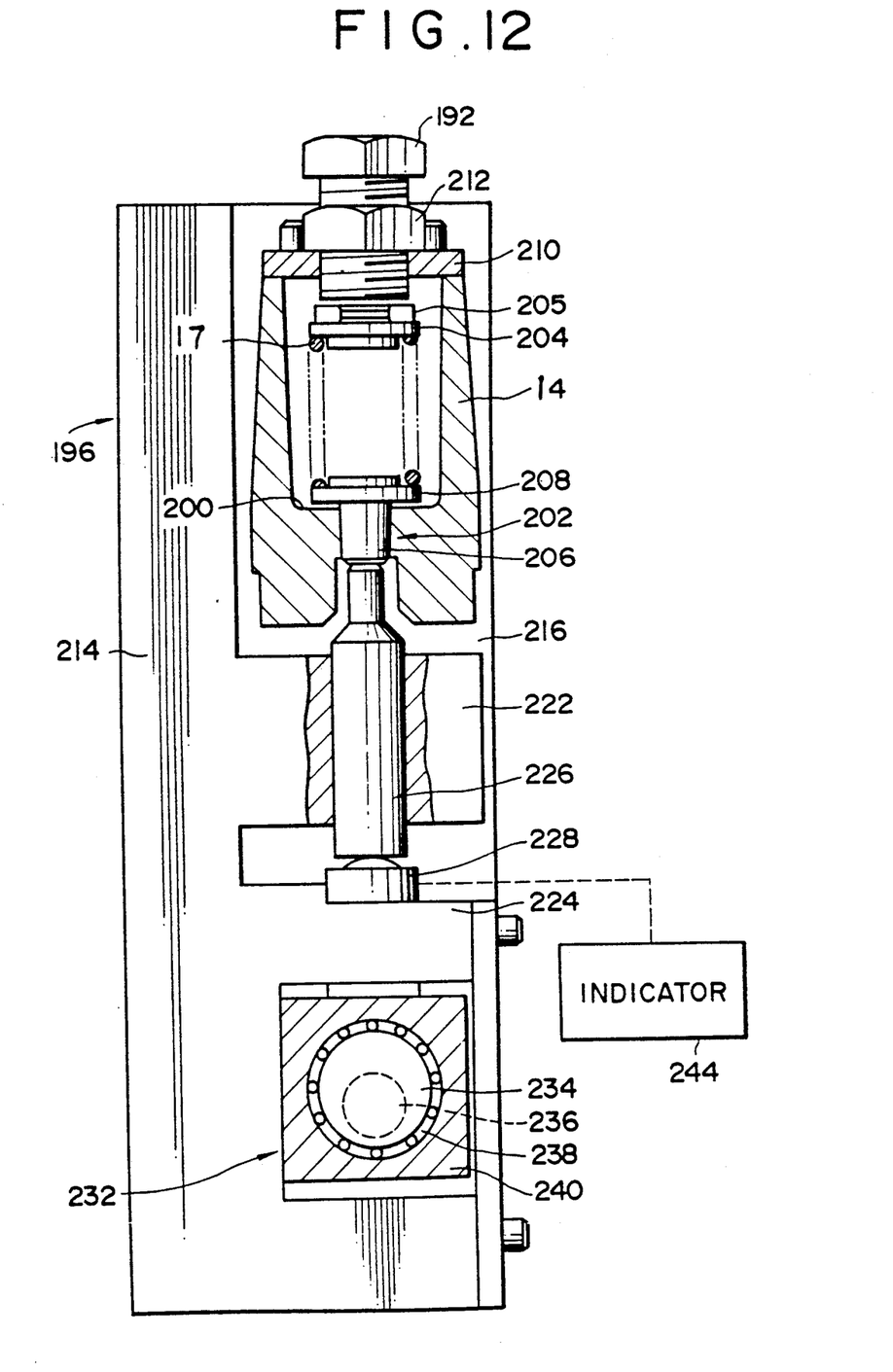
FIG. 12 shows a partially sectional side view showing an another pressure force setting state according to the present invention.
Figure 13:
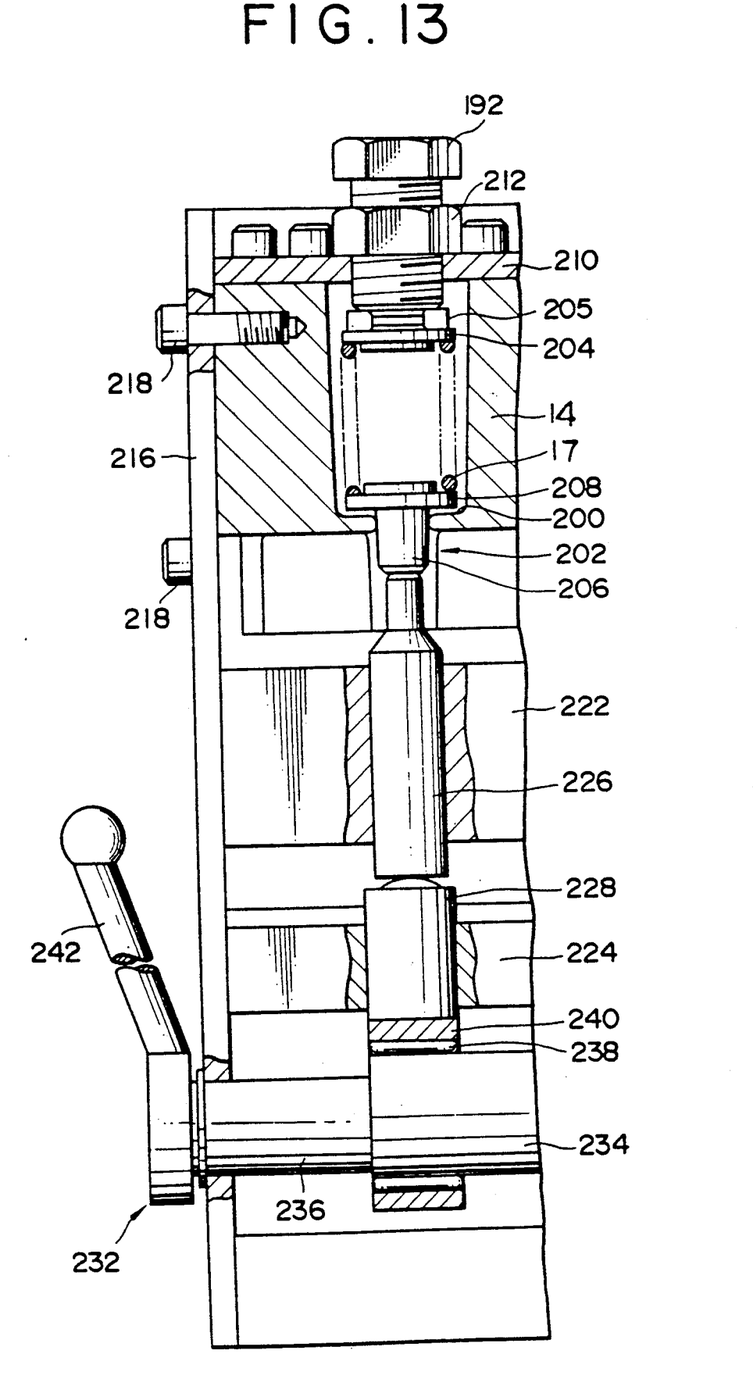
FIG. 13 shows a partial front view showing the pressure force setting state of FIG. 12.

FIGS. 12 and 13 show an embodiment of the another pressure force adjusting and setting process. In this embodiment, a load of a compression coil spring 17 of the pressure developing device is applied and maintained by a bolt 192 which is a screw part. A first block 14 supporting the compression coil spring 17 and the bolt 192 can be independently removed without removing the pressure rollers, backup rollers, etc. from other parts structuring thereof. The first block 14 structures an auxiliary frame. The side plates, the second block, etc. structure the main frame. Other structures of the pressure development apparatus are same as those of the previous embodiments. Although they are not shown, only the condition where the first block 14 is mounted on a jig main unit 196 of a pressure force adjustment jig is shown in the drawings.

At the first block 14, a bottomed hole 200 is formed and the compression coil spring 17, a spring supporter 202, a support plate 204, and a thrust bearing 205 are housed. The structure of the spring supporter 202 is the same as that of the first spring holder 44. The spring supporter 202 is composed of a shaft 206 and a support plate 208 to which one end thereof is fixed. Both the ends of the compression coil spring 17 are supported by the support plates 208 and 204. The bolt 192 is fastened in the direction in parallel with the loaded direction of the compression coil spring 17 to a plate 210 fixed to the first block 14, a lock nut 212 protecting the bolt 192 from being rotated. The thrust bearing 205 is disposed between the bolt 192 and the support plate 204. By screwing the bolt 192, a load is applied to the compression coil spring 17 and a predetermined amount of load of the compression coil spring 17 is kept. The first block 14 and the plate 210 are placed on a surface of both ends of the direction where a plurality of compression coil springs 17 are disposed.

The jig main unit 196 is designed so that the first block 14 can be mounted thereon like the frame of the pressure developing device. In other words, as shown in FIG. 12, the jig main unit 196 has a column 214 vertically extended, side plates 216 (only one plate is shown in the drawing) being fixed to both sides of the column 214. The side plates 216 are opposed so that the first block 14 can be just engaged therewith. While the first block 14 is engaged therewith, a plurality of reamer bolts 218 are fastened from the outside of the side plates 216. On the frame of the pressure developing device, a pair of side plates are opposed so that the first block 14 can be precisely engaged therebetween. In the longitudinal direction of the side plates, the first block 14 is movably removed and the reamer bolts 218 are fastened from the outside of the side plates.

On the jig main unit 196, a first support extruded portion 222 and a second support extruded portion 224 horizontally extended are disposed in positions below the first block 14. On the upper first support extruded portion 222, a pressure rod 226 is vertically and slidably fastened, the pressure rod 226 being disposed concentrically to the compression coil spring 17 when the first block 14 is mounted on the jig main unit. On the lower second support extruded portion 224, a load sensor 228 is vertically and slidably mounted, the load sensor 228 being contacted with the lower surface of the pressure rod 226, the load sensor 228 receiving a load of the compression coil spring 17 from the reverse side of the bolt 192. This load sensor 228 is raised and lowered by a cam device 232. The cam device 232 is provided with a cylindrical cam 234 and a shaft 234 eccentrically disposed against the axis center of the cam 234. The cam 234 is contacted with the load sensor 228 in a sleeve 240 fastened via a bearing 238. When the operator rotates the shaft 236 using a lever 242, the load sensor 228 is raised and lowered and the pressure rod 226 is also raised and lowered. The load sensor 228 is moved between an operation position where the pressure rod 226 pushes up the support plate 208 from the bottom surface of the bottomed hole 200, whereby the compression coil spring 17 applies a load to the pressure roller and a non-operation position where the pressure rod 226 can be lowered, whereby the compression coil spring 17 does not apply the load to the pressure roller. A detection result of the load sensor 228 is displayed on a load display device 244.

Like the above embodiments, the pressure force is adjusted when the pressure developing device is produced or when the image recording unit is maintained. In the former case, in the production process, by mounting the first block 14 to the jig main unit 196, the pressure force is adjusted. In the latter case, by removing the first block 14 from the side plate of the main frame, it is mounted to the jig main unit 196. Since the method of mounting the first block 14 to the jig main unit 196 is the same as that of mounting the side plate to the main frame, the first block can be easily mounted and dismounted.

In the mounting state, the load sensor 228 is placed in the non-operation position. Mount the first block 14 to the jig main unit 196, move the load sensor 228 to the operation position, loosen the lock nut 212, screw the bolt 192, and then apply a load to the compression coil spring 17. Since the bolt 192 is fastened to the plate 210, the load of the compression coil spring 17 is kept to the load applied by the screwing operation. After screwing the bolt 192 until a predetermined amount of load is produced, tighten the lock nut 212 and operate the lever 242 to move the load sensor 228 to the non-operation position. In this operation, when the support plate 208 is placed on the bottom surface of the bottomed hole 200, the load applied from the first block 14 to the reamer bolt 218 and mount it to the side plate of the main frame.

In this embodiment, the compression coil spring 17 and the bolt 192 are held by the first block 14, whereby they can be removed from the main frame. However, it is also possible to structure the mechanism so that one pressure roller can be removed along with them.

In the previous embodiments, the screwing operations of the screws are conducted by an operator. However, it is also possible to perform the operations using a machine by engaging a rotation operation unit therewith.

The present inventions can be embodied in various deformation and modification in the range of the spirit thereof.

What is claimed is:

1. A method of setting a pressure force in a pressure developing device which includes: a pair of pressure developing roller members at least arranged to be brought into contact with each other for pressurizing a material on which a visible image is to be developed; pressure force generating means for generating a variable force between said pair of pressure rollers, said generating means including an elastic spring member for generating said pressure force and a backup roller member arranged between said elastic spring member and one of said pair of pressure developing roller members, said backup roller extending parallel to said one of said pressure developing rollers for transmitting said pressure force to said one of the pressure developing rollers; set means for setting said pressure force generated by said force generating means at a predetermined value, said set means comprising a rod member having at least a part thereof projecting toward the outside of said pressure developing device and arranged to be brought into contact with said elastic spring member for setting a length of said elastic spring member to a value corresponding to said desired value; and exchange means for shifting said pair of rollers between a first state at which said pressure force is at said predetermined value and a second state at which said force is less than said predetermined value; said method comprising;

locating said pair of pressure developing rollers in said first state by said exchange means;

adjusting said pressure force from the outside of said pressure developing device to a desired value by said setting means; and, fixing said pressure force at said desired value by bringing a collet member into engagement with said rod member at the outside of said pressure developing device.

2. A method for adjusting pressure forces generated between a pair of pressure developing rollers of a pressure developing device, said device further including a spring member for urging said rollers toward one another, a spring receiving member for receiving said spring member, said spring receiving member including a holder having opposed edges movable in the direction of said forces, one edge of said spring member contacting one roller of said pair of pressure rollers, an opposite edge of said spring member contacting one edge of said holder, and opposite edge of said holder projecting toward the outside of said pressure developing device, and a stopper member for stopping movement of said holder under influence of said spring member; said method comprising the steps of:

connecting an adjusting device to said opposite edge of said holder and applying a desired force to said holder via said adjusting device whereby to develop a desired pressure force between said pair of rollers via said spring member;

positioning said stopper member to prevent movement of said holder from the position to which the holder is moved under operation of said applied force; and removing said adjusting device whereby the pressure force between said pair of rollers is adjusted to said desired force.

3. The method in accordance with claim 2 wherein said stopper member includes a screw member, the position of which determines the effective length of said spring member and accordingly the force exerted on said pressure rollers by said spring member.

4. The method in accordance with claim 2 wherein said device further includes a cam member arranged to shift at least one of the rollers of said pair of rollers between a first position wherein said rollers are in engaged with each other so that the pressure exerted by said rollers is said predetermined value and a second position wherein the pressure exerted between said pair of rollers is less than said predetermined value and further comprising the step of positioning said cam member so as to place said rollers in said first position prior to applying said desired force.

5. The method in accordance with claim 2 wherein said device further includes a backup roller interposed between said spring member and said pressure roller wherein said force is applied to said pressure roller via said backup roller.

* * * * *